United States Patent [19]

Aichelmann, Jr. et al.

[11] 4,172,282

[45] Oct. 23, 1979

[54] PROCESSOR CONTROLLED MEMORY REFRESH

[75] Inventors: Frederick J. Aichelmann, Jr., Hopewell Junction; Thomas P. Fehn, Mahopac, both of N.Y.

[73] Assignee: International Business Machines Corporation, Armonk, N.Y.

[21] Appl. No.: 736,969

[22] Filed: Oct. 29, 1976

[51] Int. Cl.² .................. G06F 13/00; G11C 13/00
[52] U.S. Cl. ......................... 364/200; 365/222
[58] Field of Search ............... 340/173 DR; 364/200 MS File, 900 MS File; 365/222

[56] References Cited

U.S. PATENT DOCUMENTS

| | | | |
|---|---|---|---|
| 3,387,286 | 6/1968 | Dennard | 340/173 DR X |
| 3,541,530 | 11/1970 | Spampinato et al. | 340/173 DR |
| 3,748,651 | 7/1973 | Mesnik | 340/173 DR X |
| 3,800,295 | 3/1974 | Anderson, Jr. et al. | 340/173 DR |
| 3,810,129 | 5/1974 | Behman et al. | 340/173 DR |
| 3,811,117 | 5/1974 | Anderson, Jr. et al. | 340/173 DR |
| 4,006,468 | 2/1977 | Webster | 340/173 DR |
| 4,028,675 | 6/1977 | Frankenberg | 340/173 DR X |
| 4,074,355 | 2/1978 | Tubbs | 364/200 |
| 4,084,154 | 4/1978 | Panigrahi | 365/222 |

*Primary Examiner*—Raulfe B. Zache
*Attorney, Agent, or Firm*—Theodore E. Galanthay

[57] ABSTRACT

In an electronic data processing system having a plurality of dynamic memory units associated therewith, the presently disclosed technique simultaneously refreshes a plurality of asynchronously operating memory units providing synchronous availability to the processor. The processor includes means for determining whether any of the memory units will be required by the processor within a time interval required to perform a refresh operation and, if not, then a "force refresh" signal is sent to the memory system to synchronously refresh all the memory units. Each of the dynamic memory units retains its internal refresh scheme to prevent loss of the stored information in the event that a force refresh signal is not received within the retention time of the dynamic memory unit.

12 Claims, 11 Drawing Figures

PROCESSOR CONTROLLED MEMORY REFRESH

CROSS-REFERENCE TO RELATED PATENTS

1. Spampinato et al, U.S. Pat. No. 3,541,530 entitled "Pulse Power Four Device Memory Cell".
2. Dennard, U.S. Pat. No. 3,387,286 entitled "Field-Effect Transistor Memory".
3. Anderson et al, U.S. Pat. No. 3,800,295 entitled "Asynchronously Operated Memory System".
4. Behman et al, U.S. Pat. No. 3,810,129 entitled "Memory System Restoration".
5. Anderson et al, U.S. Pat. No. 3,811,117 entitled "Time Ordered Memory System and Operation".

BACKGROUND OF THE INVENTION (1) Field of the Invention

This invention relates to electronic data storage systems. More particularly, this invention relates to the use of the processor unit to control the regeneration of a plurality of asynchronously operating dynamic memory units.

(2) Description of the Prior Art

The cross-referenced Dennard patent discloses one type of dynamic memory element which requires periodic restoration of stored information. (It is here pointed out that the terms "restoration", "regeneration", and "refreshing", are relatively interchangeable terms and are used synonymously in the present application to describe the desired function of preventing the loss of information in a dynamic memory.) According to Dennard, restoration may be interleaved with normal memory operation by using, for example, every tenth cycle of the memory to restore one of the word positions in the array. Alternatively, Dennard teaches restoration in a burst mode by interruption of normal memory operation and restoration of the information in the entire memory during the interruption. Either approach accomplishes the desired restoration satisfactorily, but both have an effect on operation of a system incorporating a memory using these schemes, since it is necessary to interfere with normal memory operation while the restoration is being carried out.

The memory cell in the Dennard patent is extremely simple, consisting of a capacitive storage element gated by a field effect transistor. Such a memory cell has great potential for use in inexpensive, large capacity integrated circuit memories, due to its inherent simplicity. To meet the goal of low cost, it is essential that a memory cell be small in integrated circuit technology. However, reductions in size result in reduction in the capacitance of the storage element. The smaller the capacitance, the more often is restoration necessary. Thus, it is readily apparent that the optimization of refresh schemes is a significant technological problem.

The cross-referenced Spampinato et al patent discloses a different type of memory cell that also requires periodic refreshing and is known as a four device memory cell. Also known in the art are memory cells having two devices or three devices and also requiring periodic refreshing. The purpose of cross-referencing the Spampinato et al patent is to point out that dynamic memories are available in various technological configurations and that the present invention relates to all such dynamically operated memories.

The problem of refreshing dynamic memories has been addressed in a large number of patents and publications suggesting improvement and optimization. For example, refer to the cross-referenced patents to Anderson et al and Behman et al. Anderson et al, U.S. Pat. No. 3,800,295 discloses a memory system including a plurality of dynamic storage memories, each controlled by its own independent refreshing means, and a processor capable of interacting with a selected memory when access to the selected memory through the processor is desired. This system allows the refresh interval for each memory to be adjusted independent of the system to the extent of the extrinsic capability of its individual characteristics. FIG. 1 of this Anderson et al patent shows the prior art in which a processor 24 is connected to a plurality of memories operating under a single refresh control and timing. FIG. 2 illustrates the technique disclosed in the patent in which a separate refresh control and timing is associated with each of the N memory units. These two techniques as well as other prior art teachings describe the details of memory operation and attempts at optimizing the time during which a dynamic memory makes itself available to the processor. They all, however, fail to address or solve the problem of synchronizing a plurality of asynchronously operating memory units.

Also known in the prior art are static memory arrays as well as techniques by which four device memory cells, for example, can be operated in a manner to appear DC stable or static to the processor. Such prior art is not discussed in detail because the present invention is directed to a technological area in which it is desired to use a dynamic memory. It is noted that all the cross-referenced patents relate to techniques by which a dynamic memory refreshes itself and is then available to the processor. As pointed out, the prior art addresses the optimization of such restoration to increase the percent availability and general utility of the memory to the processor. In this manner, the prior art appears to have addressed the refresh problem from the viewpoint of improving dynamic memory operation. Accordingly, the prior art appears to have failed to address the problem from an overall systems point of view. For this reason, the prior art appears not to have suggested a technique of tailoring refresh to the particular processor requirements. Thus, the improvements in memory refresh techniques as described in the prior art are limited by the improvement to the memory itself as opposed to the optimization of the overall processing system including a processor with a plurality of memory units.

SUMMARY OF THE INVENTION

Accordingly, it is a primary object of this invention to provide a dynamic memory system refresh technique in which the processor controls the synchronization of a plurality of dynamic memory units.

It is another object of this invention to generate a refresh signal within a processor unit which overrides the refresh means incorporated in the various memory units.

It is a further object of this invention to provide a memory refresh scheme uniquely adapted for systems having a central processor for processing electronic digital information in a serial mode under the control of a read only storage.

The attainment of these and related objects may be achieved by placing the refresh of a plurality of memory units under the control of the processor. As illustrated in the cross-referenced U.S. Pat. No. 3,800,295, the processor 24 is illustrated having interconnections with a memory BSM 60. It is assumed that by BSM is meant a basic storage module having an array 68 which might include a plurality of memory chips for memories such as illustrated by reference numerals 14, 16, 18, and 20. The present invention goes one step beyond in the sense that a processor is operatively associated with a plurality of memory units or memory BSM's, of the type disclosed, for example, in U.S. Pat. No. 3,800,295. It becomes apparent that a plurality of such memory units operating asynchronously with each other could result in a worse case situation in which the processor is forever waiting for one or the other of the memory units to refresh itself. Thus, for example, while the processor requires access to memory unit or BSM number 1, it must wait until refresh is completed and the unit is available. Upon completing the operation requiring BSM number 1, BSM number 2 might be desired which might then be in its state of refresh again requiring the processor to wait.

In accordance with the presently disclosed technique, the processor includes means for detecting processor operations which require the use of memory and/or processor operations which do not require the use of memory. During those operations when the memories are not required, a "force refresh" line simultaneously refreshes all the memory units within the overall memory system. This force regeneration overrides the internal refresh scheme of each memory unit and furthermore resets all the timing controls within each unit so that internal refreshing will not take place for the maximum possible time. The internal refresh scheme of course is set to automatically refresh each memory unit within the retention time of the dynamic memory to prevent the loss of information in a case where a "force regenerate" signal has not been received from the processor.

Accordingly, under processor control, memory idle periods are used to take an advance refresh thereby forestalling additional refreshes until a complete refresh interval is used up. The present technique would still take advantage of all improvements related to the extension of retention time of individual cells or techniques for improving the percentage of the time in which an individual unit is available to the processor. As a further improvement in optimization, a plurality of memory units forming a memory system and associated with a central processor provide an overall system improvement by the synchronization of all memory units under processor control.

The foregoing and other objects, features and advantages of the invention will be apparent from the following and more particular description of preferred embodiments of the invention, as illustrated in the accompanying drawings.

DESCRIPTION OF THE PREFERRED EMBODIMENTS

Figure 1:
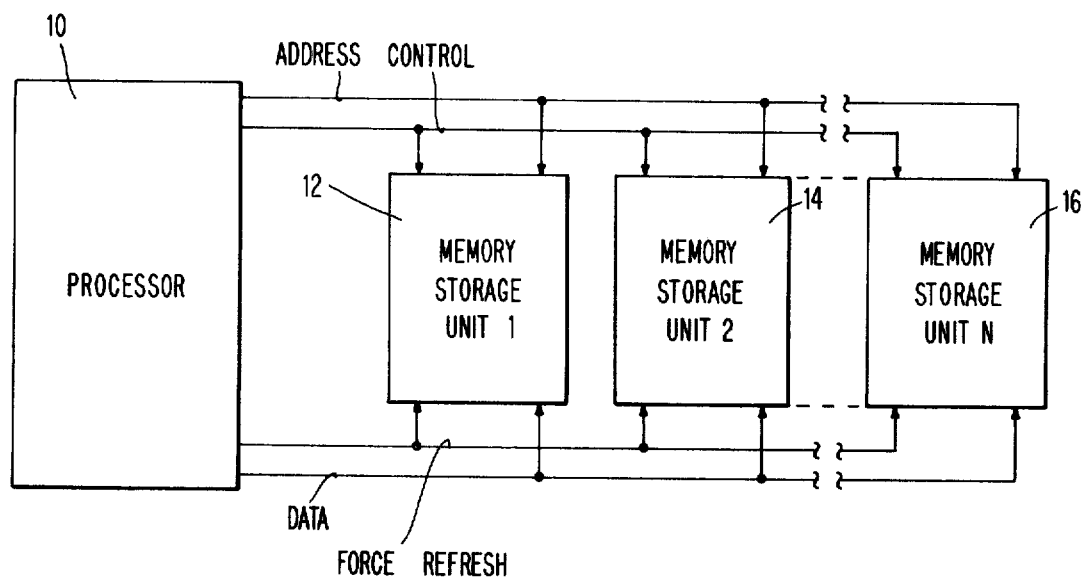
FIG. 1 is a generalized block diagram of an overall system in accordance with the invention.

Referring now to the drawings and particularly FIG. 1, there is illustrated a generalized block diagram of an overall system in accordance with the present invention. A processor 10 is connected to memory storage unit number 1 (also designated as reference numeral 12) by address, control, and data buss lines in a manner well known in the prior art. Processor 10 is also connected to additional memory storage units 14 and 16 in the same manner as it is connected to memory storage unit 12. Each memory storage unit is essentially a memory BSM as described in the prior art. The present invention addresses the additional connection between processor 10 and the various memory storage units by means of a "force refresh" line as shown. The force refresh signal applied on the force refresh line serves to synchronize the various memory storage units resulting in an overall system improvememt as described in greater detail hereinbelow.

Figure 2A:
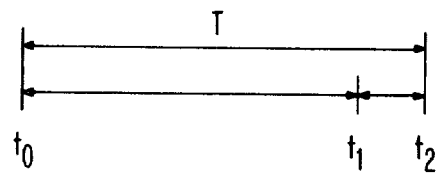
FIGS. 2A, 2B, and 2C, are timing diagrams.

FIG. 2A is a timing diagram in which an operation cycle of a memory storage unit such as memory storage unit number 1, for example, is identified by time T. The time during which the memory is available to the processor is from time $t_o$ to $t_f$ while the time required to accomplish the refresh operation is identified by the interval from t1 to t2.

Figure 2B:
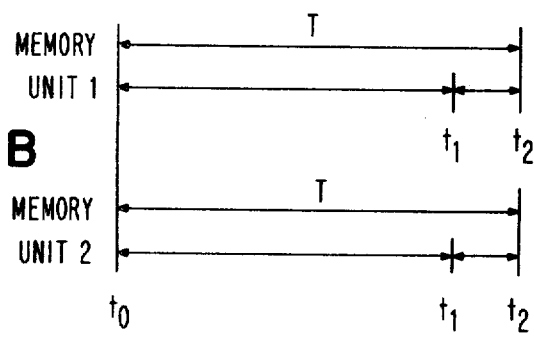

FIG. 2B illustrates the case where two of the memory storage units have a similar time availability and retention time relationship. Illustrated is the case where both memories are started at time $t_o$.

Figure 2C:
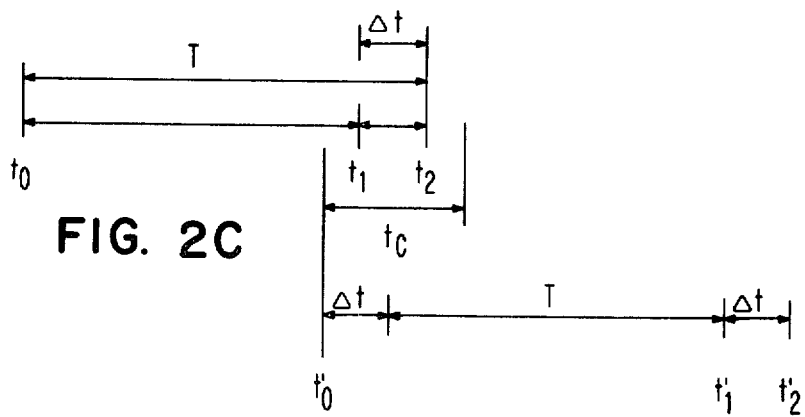

FIG. 2C illustrates how by conventional techniques, two memory storage units would inevitably be caused to operate asynchronously. For purposes of example, it is assumed that the processor requires access to the memory during the time interval defined as $t_c$. Since the desired access interferes with the internally scheduled regeneration, a refresh will be taken by the memory at $t_o'$. Upon completion of the refresh during the same time frame ($\Delta t$) as is always required for a refresh, the processor is permitted access to the memory unit. Note, however, that the time frame allotted for availability and the normally scheduled time for refresh has been shifted in time. Without the force refresh technique of the present invention, this selected memory storage unit would now be out of synchronism with the other memory storage units in the over all memory system.

Figure 3:
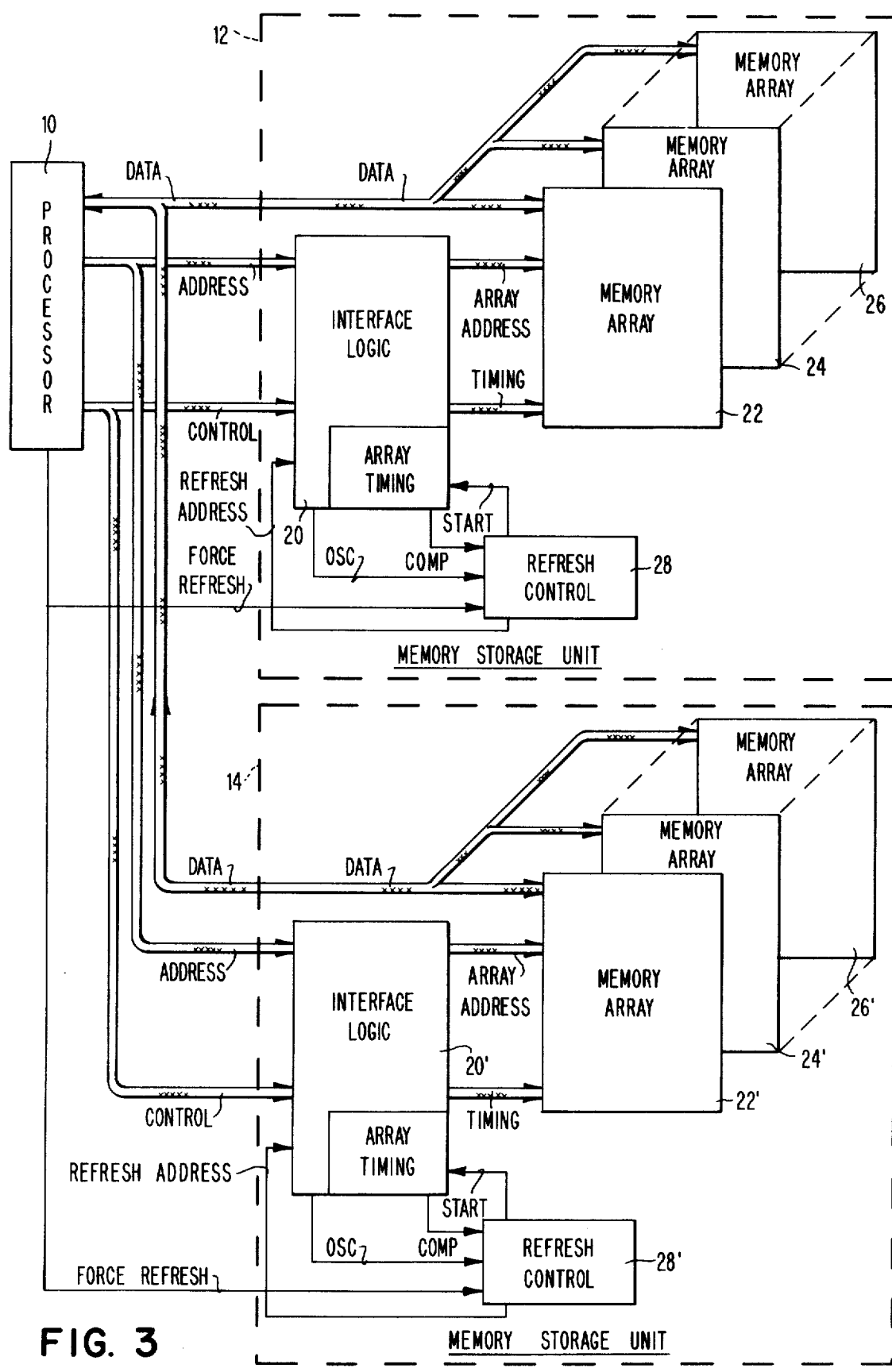
FIG. 3 is a more detailed block diagram of a preferred embodiment of an overall system configuration in accordance with the present invention.

Refer now to FIG. 3 which is a more detailed block diagram of a system in accordance with the present invention. As illustrated, the present system includes a processor 10 and a plurality of memory storage units 12 and 14. Each of the memory storage units is operatively connected to and associated with the processor 10 by conventional address, control, and data buss lines. Memory storage unit 12 includes interface logic 20 which receives the address and control lines from the processor. Interface logic 20 performs the conventional address, decode, and drive function as well as the timing controls, etc. This is all well-known in the prior art as described in one or more of the cross-referenced patents. The data buss is connected to the plurality of memory arrays 22, 24, and 26 also in the conventional and well-known manner. In fact, the only modification to a standard memory storage unit 12 required by the present invention is the ability of refresh control 28 to accept a force refresh input.

As illustrated in FIG. 3, refresh control 28 also gets an oscillator (OSC) input from interface logic 20; this oscillator input usually coming from processor 10 via one of the control lines. As illustrated in FIG. 3, the array timing is schematically shown as being part of the interface logic and receiving a start refresh cycle timing signal (START) from refresh control 28 and providing a "refresh cycle complete" signal (COMP) to refresh control 28. Refresh control 28 also provides the refresh address to interface logic 20 which in turn applies the array address and necessary timing signals to the memories by way of the indicated lines.

Memory storage unit 14 is intended to be identical in every respect to memory storage unit 12 and, as indicated, receives the same inputs from processor 10 including the identical force refresh signal. The individial blocks within memory storage unit 14 have been designated by prime notation to indicate their correspondence. As previously pointed out the internal construction of each of memory storage units 12 and 14 is known in the prior art except for the details of refresh control 28 and 28' which will be described in greater detail hereinbelow.

Figure 4:
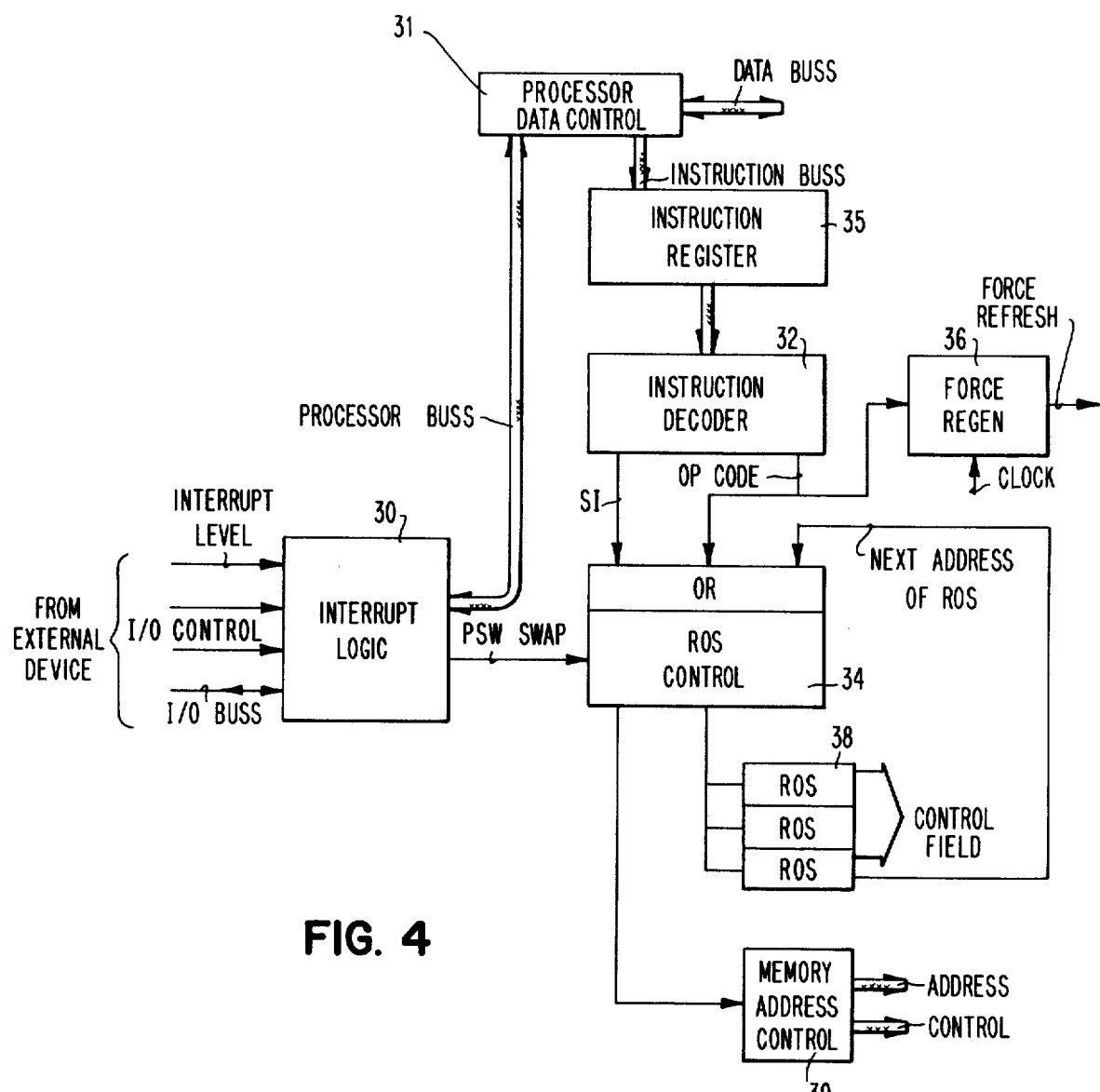
FIG. 4 is a block diagram of a portion of a central processor as used in accordance with the present invention.

A portion of the internal structure of processor 10 is set forth in FIG. 4 to explain in greater detail one aspect of the present invention. External devices provide signals to interrupt logic 30. Such signals typically include interrupt levels, and input output device (I/O) control lines and a data buss. Interrupt logic has outputs to various portions of the processor 10 as, for example, a program status word (PSW) swap to read only store control 34. Another output of interrupt logic 30 is connected to a processor data control 31 via the processor buss. It is the function of processor data control 31 to gate the information from the interrupt logic to other portions of the processor, as for example to instruction register 35 via the instruction buss. Alternatively, the process data control 31 gates data to the memory system via the data buss. Similarly, data coming from the memory system via the data buss may either be gated to instruction register 35 via the instruction buss or to interrupt logic 30 via the processor buss. It is understood that data and control signals may be gated to other portions of the processor (not shown) as is well-known in the data processing art. Also, interrupt logic 30 may send output signals to other portions of processor 10 as for example, directly to read only store control 34.

In accordance with one aspect of this invention, instruction register 35 transmits the instructions to instruction decoder 32 which provides an output to ROS control 34 as well as force regenerator 36. Force regenerator 36 also receives a clock input from the processor system clock (not shown) and provides a force refresh output to the memory system.

Read only store control 34 is shown as having an OR gated input to show that a plurality of sources may provide inputs to the ROS control. For example, instruction decoder 32, in addition to the previously indicated OP code, also provides a starting address (SI) to ROS control 34. The outputs of read only store control 34 are inputed to read only store 38 which then goes through its various cycles and by means of the control field output controls the serial operations within the processor. Upon the completion of any step within the read only store 38, the "next address of ROS", that is, the next address within the read only store to be accessed, is inputed into ROS control 34. In this manner, the next designated operation is performed in read only store 38 and applied to the various devices within the processor as a control field. Upon the completion of a series of steps, new instructions are received through the instruction decoder 32 or from interrupt logic 30 indicating either a new starting address (SI) or a new command such as PSW swap.

It is also known that during operations requiring memory, memory storage units are accessed by means of memory address control 39 which receives an input from read only store control 34 and provides the address and control signal outputs to the memory system. Operations within the processor are, however, controlled by read only store 38 and a sequence of steps are normally carried out each time a new instruction is received into ROS control 34. It is predeterminable whether such a sequence of steps will require a memory operation or not, by a knowledge of the program and the nature of the particular instruction. For this reason, it is known as soon as a new instruction is received whether or not the memory system will remain idle for a period sufficient to perform the force regenerate function. In one embodiment, the OP code is transmitted from the instruction decoder 32 to the force regenerator 36 which will generate a force refresh signal upon the occurrence of an OP code indicating an instruction which provides sufficient memory idle time. As becomes evident, the force generator 36 is what has been added by the present invention to the otherwise conventional processor illustrated in FIG. 4.

Figure 5:
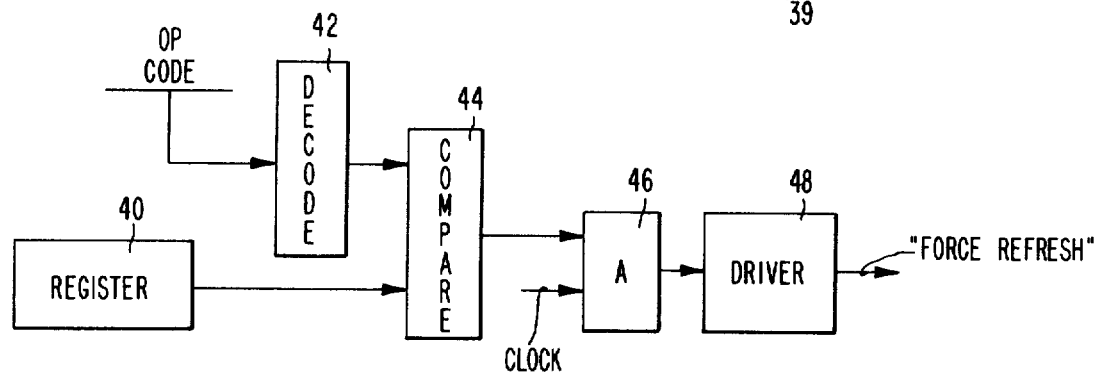
FIG. 5 is a more detailed block diagram of the "force regen" force generator within the processor unit.

The details of one embodiment of force regenerator 36 are illustrated in FIG. 5. As illustrated, the OP code is decoded in decode 42 and provided to compare circuit 44. All the OP codes which have been predetermined to have sufficient memory idle time for memory refresh are stored in register 40. Compare circuit 44 compares the decoded OP code from decode 42 with all the OP codes stored in register 40 and if a compare is found, a refresh command signal is sent to AND circuit 46. Upon the occurrence of a clock input to AND circuit 46, a force refresh signal is transmitted to the memory units by means of driver 48.

Figure 6:
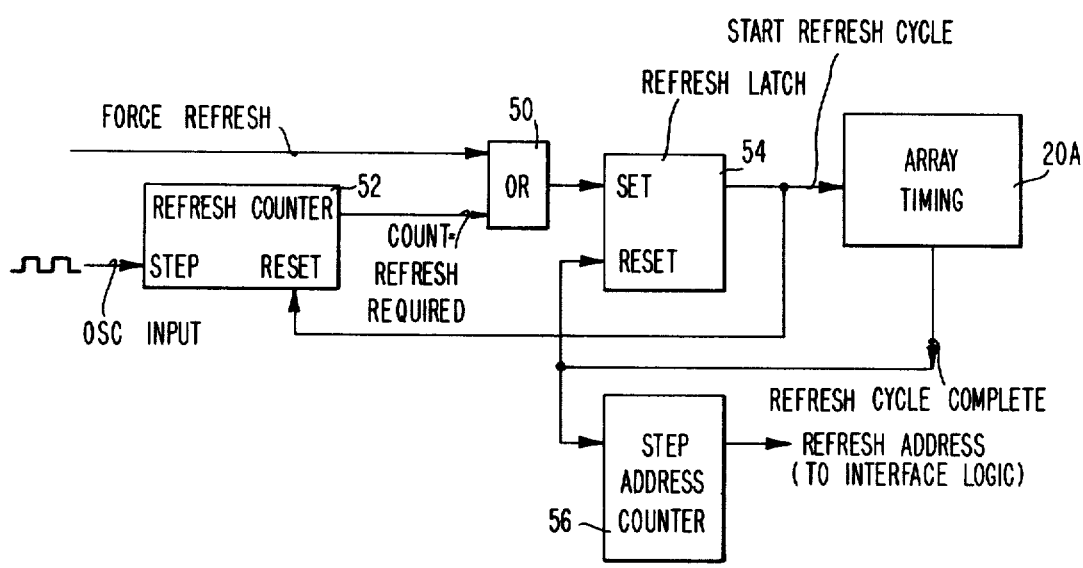
FIG. 6 is a more detailed block diagram of the refresh control within a memory unit.

The force refresh signal transmitted to the memory storage unit is usually applied to a refresh control circuit 28 which is illustrated in greater detail in FIG. 6. Without the force refresh feature, a refresh counter 52 is typically stepped by an oscillator input. When the count in the counter equals the count that requires refresh, the refresh latch 54 is set and the array timing 20A is commanded to start a refresh cycle. The refresh latch is reset and the step address counter 56 begins to refresh the addresses within the memory storage unit. When the refresh cycle is completed, the refresh latch is reset while the refresh counter has been previously reset by an output from the refresh latch. At this point in time the memory storage unit becomes available to the processor until the next refresh is indicated by the count in the counter.

In accordance with the present invention, a force refresh signal applied to OR circuit 50 provides the same command previously supplied by the refresh counter, causing the memory storage unit to be refreshed. As has been pointed out, in the event a force refresh is not received again until the counter reaches its count, then the memory storage unit will still refresh in its customary manner. The array timing (conventional in memory storage units) has been previously indicated in FIG. 3 as being a portion of logic interface 20 and for this reason has been designated by reference numeral 20A.

Figure 7:
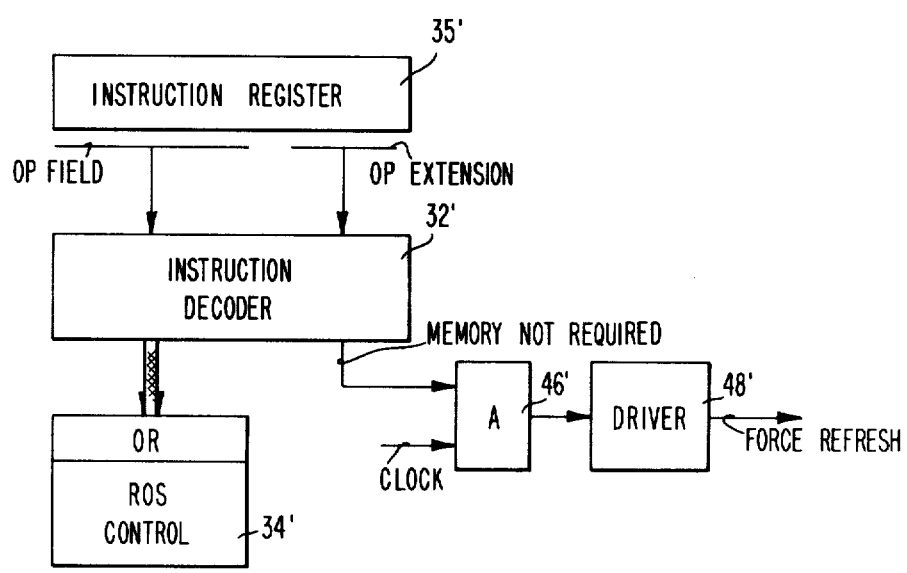
FIGS. 7 and 8, illustrate alternate techniques by which the processor determineds when a force refresh signal should be generated.

The foregoing describes an overall system configuration in which impending memory activity is known. Accordingly, those operations not requiring a memory are detected and force all memory units in the memory system associated with the processor to refresh thereby making all memories available during subsequent memory cycle times. Another technique for identifying when a force refresh command is to be sent to the memory system is illustrated in FIG. 7. Corresponding elements have been identified with corresponding reference numerals with a prime notation, isofar as practical. Referring to FIG. 7 together with FIGS. 4 and 5, the instruction decoder 32 previously shown in FIG. 4 is illustrated as instruction decoder 32' in FIG. 7. It receives an input from instruction register 35' which includes an operation field (OP FIELD) and an operation extension (OP EXTENSION). The instruction decoder provides an output to ROS control 34' in the conventional manner. The OP Extension includes a code as to whether the particular instruction requires a memory operation or not. If a memory operation is not required, instruction decoder 32' so indicates on its output line to AND circuit 46'. Upon an indication that a memory is not required and during the appropriate clock input, AND circuit 46' provides a force refresh signal to the memory system. A driver circuit 48' corresponding to the driver 48 in FIG. 5 would normally be used to transmit the force refresh signal from the processor to the memory system.

Figure 8:
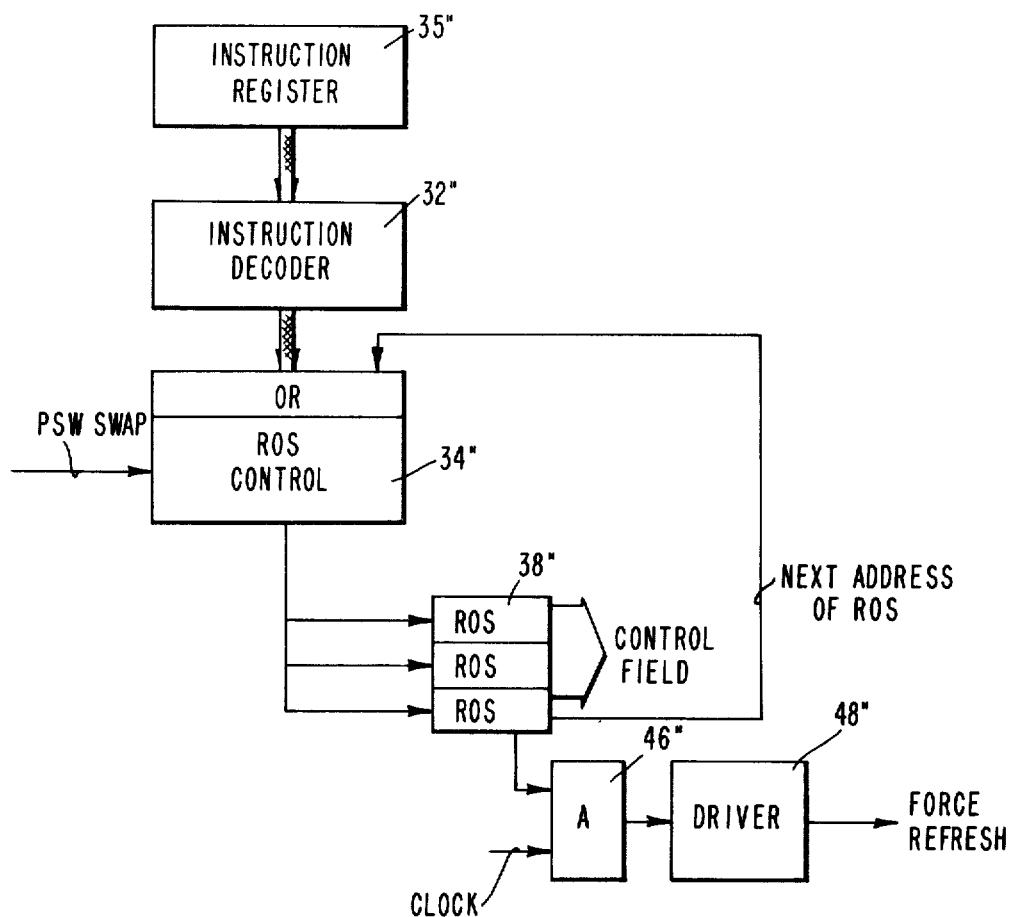

Another technique by which the memory idle time might be determined, when a force refresh operation should take place, is illustrated in FIG. 8. Instruction decoder 32" and instruction register 35" have again been designated with double prime notation inorder to signify the correspondence to previous drawing figures. Similarly, the read only storage control 34" connected to the output of the instruction decoder and providing an output to the read only storage unit 38" have been designated with double prime notation. In this embodiment, it is noted that the read only store words are provided with an extra bit which flags those operations for which a memory is not required. Thus, as the read only store 38" is actuated by an input from the read only store control 34", the read only store 38" provides its normal output which is a control field controlling the operation of the entire processor. The output of read only store 38" includes the next read only store address to the read only store control 34" because read only store 38" is normally programmed for a series of instruction steps. By the use of an extra bit in the memory words stored in the read only store 38", those operations that will not require access to the memory system for at least the length of time required to refresh the memory system are identified by this special bit. Upon the reading out of this special bit and the occurrence of a clock pulse at the inputs of AND circuit 46", a force refresh is sent to the memory system by means of driver circuit 48".

Figure 9:
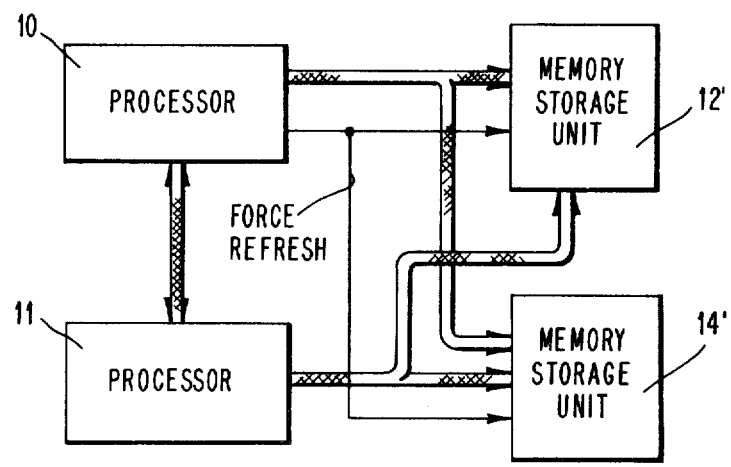
FIG. 9 is another embodiment illustrating the present invention in a multi-processor environment.

FIG. 9 illustrates a still further embodiment in which a plurality of processors 10 and 11 operate as a system with a plurality of memory units 12' and 14'. As is conventional, each processor 10 and 11 has a control and data connection to each of the memory units 12' and 14' while control and data lines also connect processor 10 and processor 11 to each other. As is conventional in systems employing multiple processors, one of them is designated as a maintenance processor. In this case processor 10 is illustrated as the maintenance processor and makes the determination as to when neither processor 10 nor 11 requires a memory operation. In that event, a refresh signal is sent to all memory units in order to simultaneously force refresh all memory units. In a type of system not including a maintenance processor, all processors could provide a force refresh input to an AND circuit, the output of the AND circuit refreshing all memories when all processors indicate that a memory operation is not required.

The operation of the herein described system is substantially identical to the operation of data processing systems well-known in the art such as for example described in the cross-referenced patents. The present invention finds particular use in the so called "miniprocessor" and "microprocessor" areas in which processing is performed under the control of a read only store. In this type of system, operations are performed in series. Accordingly, a starting address (SI) selecting a particular series of operations in the read only store usually provides an indication whether there is time for a force refresh before a memory operation will be required. Every time a force refresh operation takes place, all the memory units in the system are synchronized optimizing the availability of all memory units to the processor(s).

With reference back to the illustration in FIG. 2A, time T is the memory cycle in which a dynamic memory is available to the processor from time $t_o$ to $t_f$. During the time interval from t1 to t2 the memory system must be refreshed. Assuming that all memories are initially simultaneously refreshed, memory storage unit number 1 will be in the same time relationship as memory storage unit number 2 (as will all other memories units in the system) as illustrated in FIG. 2B. This is highly desirable and efficient to have all the memory units in a system available to the processor at the same time. As illustrated in FIG. 2C, however, it is possible for two memory units to get out of sequence. This is caused by the need for one of the memory units by a processor during an interval that interferes with normal refresh. As illustrated in FIG. 2C, a refresh cycle ($\Delta t$) must be taken before the desired memory access cycle $t_c$ can take place. This automatically throws memory storage unit number two out of sequence with memory storage unit number one. By the present technique of force regeneration, this is less likely to occur since the memory will usually have undergone regeneration just prior to the time a memory cycle is to be taken. Furthermore, if the problem illustrated in FIG. 2C should occur, then during the very next memory idle time indicated within the processor, all memory storage units will again become synchronized with each other.

The force refresh causing the synchronization of multiple memory units illustrated in FIG. 2B is accomplished in accordance with the structure illustrated in FIG. 3. Processor 10 and memory storage units 12 and 14 operate in their conventional and well-known manner. In accordance with the present invention, the force refresh line from processor 10 to each of memory storage units 12 and 14 is added. When processor 10 determines that the memory will not be needed for a time sufficient for refreshing, a force refresh signal will be transmitted to memory storage unit 12 and 14, simultaneously refreshing them. This force refresh signal will override the internal refresh provided by refresh control 28 and 28' and will render the memory storage units available to processor 10 during subsequently required memory cycles. In the event, however, that processor 10 requires memory operations for a period of time in excess of the retention time of the memory storage units, then, of course, the internal refresh controls 28 and 28' will provide the necessary refresh. During a subsequent memory idle cycle in processor 10, however, the force refresh line will again regenerate all memory storage units in synchronism. Thus, the plurality of memory storage units which operate asynchronously in the prior art will now be synchronously available to processor 10.

One technique by which processor 10 determines that a force refresh is to take place is illustrated in FIG. 4. Instructions would normally be stored in an instruction register 36 prior to application to instruction decoder 32. The instruction decoder 32 provides the starting address (SI) to an OR circuit within ROS control 34. In one embodiment, instruction decoder 32 also provides a decoded OP code signal to force regenerator 36 which generates the force refresh signal. Force regenerator 36 also receives a clock input from the processor 10 system clock (not shown) so that any force refresh signals are in synchronism with the remainder of the system. ROS control 34 provides an output to read only store 38, which will then go through a sequence of addresses "next address of ROS" inputted to another input of the OR circuit of ROS control 34. During this time, memory system operations might not be required. In such a case, the OP code received by force regenerator 36 will cause it to transmit a "force refresh" signal to the memory system.

Refer now to FIG. 5 which illustrates the force regenerator circuit of FIG. 4 in greater detail. In one embodiment, force regenerator circuit 36 may include a storage of all the OP codes which do not require memory operations and which are of sufficient duration to permit a force refreshing of memory. These OP codes may be stored in register 40 for example. The incoming OP code is decoded by decode circuit 42. The output of decode circuit 42 is compared with each of the OP codes within register 40 in compare circuit 44. Register 40 may be of the recirculating type, continually presenting its stored OP codes to compare circuit 44. Upon the occurrence of a favorable comparison, that is the OP code indicates that a memory operation is not required for a predetermined length of time, an output is supplied to AND circuit 46 which receives as its other input a clock input. Accordingly, during the appropriate clocking period, a signal is provided by AND circuit 46 to driver circuit 48 which provides a force refresh output to all of the memory storage units.

The force refresh output is received at OR circuit 50 of refresh control 28 as illustrated in FIG. 6. Refresh control 28 receives another input at refresh counter 52. This other input is an oscillator input from the oscillator usually within processor 10 (not shown). The output of refresh counter 52 is also provided to OR circuit 50 which provides an output to refresh latch 54. Refresh latch 54 provides an output to the array timing circuit 20A and also to the reset input of refresh counter 52. The array timing 20A provides a reset output to refresh latch 54 and also steps address counter 56 providing the address to be refreshed to interface logic 20 which in turn passes it on to the appropriate memory arrays. Essentially, the modified portion of refresh control 28 as depicted in FIG. 6 consists of OR circuit 50 which provides an override by setting refresh latch 54 and resetting refresh counter 52 without an output from refresh counter 52.

By using available system time, for forcing refresh in the memory storage units, an order of improvement is obtained over and above that provided by the various internal memory refresh techniques described in the cross-referenced patents. The present invention also finds use as a diagnostic tool in that the force refresh signal can be used to find various faults such as, for example, a faulty clock. In the event of a power "brown out" in which supply voltages are lowered, more frequent refreshes are usually required. Since the counter of the memory storage units is set for a predetermined count, such time intervals might exceed the retention time of the memory units when the supply voltage is lowered. In cases such as this, the processor unit can be used to provide more frequent refresh operations to prevent loss of data through the force refresh line. Another useful feature of the present invention is that when the system is first started up, the force refresh line may be used to exercise the memory storage unit prior to actual operation. The system then provides reliable operation from the time actual programs are run.

The present invention has a special advantage for controllers in which operations are performed in series and different time length operations are performed. This makes it relatively simple at the beginning of a particular operation to determine whether a sufficient length of time will elapse during which a memory is not required. Such available time periods can be readily flagged, as described hereinabove, and are ideally adapted to force refresh memory storage units.

While the invention has been particularly shown and described with reference to preferred embodiments thereof, it will be understood by those skilled in the art that various changes in form and detail may be made therein without departing from the spirit and scope of the invention.

What is claimed is:

1. A data processing system having a processor for processing electronic digital information, said processor having defined time intervals during which either memory, or non-memory operations take place, the improvement comprising:

a memory system including a plurality of dynamic memory units each of said memory units requiring a refresh signal to preserve the stored information, each said dynamic memory unit having refresh means incorporated therein for performing said required periodic refreshing;

an electrical connection between said processor and said memory system;

detecting means responsive to at least a portion of an instruction within said processor for detecting when a non-memory operation is taking place;

said electrical connection between said processor and said memory system being responsive to said detecting means and including means for transmitting a signal to each of said memory units, when said processor is performing a non-memory operation; and means responsive to said refresh means incorporated in each said dynamic memory unit for determining that a refresh was accomplished thereby setting a new time reference before a next subsequent refresh of the stored information is required.

2. A data processing system as in claim 1 wherein said means for detecting when a non-memory operation is taking place is contained within said processor.

3. Apparatus as in claim 1 wherein said means for determining that a refresh was accomplished is contained within each said plurality of dynamic memory units.

4. Apparatus as in claim 1 further comprising:
a read only storage unit for controlling said processor to perform instructions in a serial mode.

5. Apparatus as in claim 4 wherein said means for detecting when a non-memory operation is taking place comprises:
a force regeneration circuit which receives an extra bit position signal from said read only storage unit via said processor indicating when a non-memory operation is taking place, said force regeneration circuit also receiving a clock signal for providing a force refresh signal to each of said memory units.

6. Apparatus as in claim 1 wherein said means for detecting when a non-memory operation is taking place comprises:
a force regenerating circuit responsive to a portion of an instruction within said processor, said force regenerating circuit also being responsive to a clock signal; and
means within said force regenerating circuit for determining when a non-memory operation is taking place;
whereby said force regenerating circuit provides a refresh signal to said means for transmitting upon the occurrence of said clock signal.

7. Apparatus as in claim 1 wherein said means for detecting when a non-memory operation is taking place comprises:
a regeneration circuit which receives an instruction bit from said processor indicating that said memory system is not required, said regeneration circuit also receiving a clock signal and providing a force refresh signal to each of said memory units.

8. Apparatus as in claim 1 wherein said processor is a first processor, said data processing system additionally comprising:
a second processor having defined time intervals during which either memory, or non-memory operations take place;
an electrical connection between said first processor and said second processor;
an electrical connection between said memory system and both said first and said second processor said last mentioned connection between said first processor and said memory system including means for transmitting a force refresh signal to said memory system, when both said first and second processor are performing a non-memory operation, said first processor being a maintenance processor controlling when said memory system is force refreshed.

9. A data processing system having a processor for processing electronic digital information, said processor having defined time intervals during which either memory, or non-memory operations take place, the improvement comprising:

a memory system including a plurality of dynamic memory units each of said memory units requiring a refresh signal to preserve stored information; and
means for detecting when a non-memory operation is taking place and for causing said memory system to be refreshed during the time interval when said non-memory operation is taking place;
said means for detecting being connected to said processor and comprising:
a force regenerating circuit responsive to a portion of an instruction within said processor, said force regenerating circuit also being responsive to a clock signal; and means within said force regenerating circuit for determining when a memory idle operation is taking place;
whereby said force generating circuit provides a refresh signal upon the occurrance of said clock input signal.

10. A data processing system having a processor for processing electronic digital information, said processor having defined time intervals during which either memory, or non-memory operations take place, the improvement comprising:
a memory system including a plurality of dynamic memory units each of said memory units requiring a refresh signal to preserve stored information; and
means for detecting when a non-memory operation is taking place and for causing said memory system to be refreshed during the time interval when said non-memory operation is taking place;
said means for detecting being connected to said processor and comprising:
a regeneration circuit which receives an instruction bit from said processor indicating that said memory system is not required, said regeneration circuit also receiving a clock signal and providing a force refresh signal to each of said memory units.

11. A data processing system having a processor for processing electronic digital information, said processor having defined time intervals during which either memory, or non-memory operations take place, the improvement comprising:
a memory system including a plurality of dynamic memory units each of said memory units requiring a refresh signal to preserve stored information;
means for detecting when a non-memory operation is taking place, and for causing said memory system to be refreshed during the time interval when said non-memory operation is taking place; and
a read only storage unit for controlling said processor to perform instructions in a serial mode;
said means for detecting being connected to said processor and comprising:
a force regeneration circuit which receives an extra bit position signal from said read only storage unit via said processor indicating when a non-memory operation is taking place, said force regeneration circuit also receiving a clock signal for providing a force refresh to each of said memory units.

12. A data processing system having a first processor for processing electronic digital information, said first processor having defined time intervals during which with memory, or non-memory operations take place, the improvement comprising:

a memory system including a plurality of dynamic memory units each of said memory units requiring a refresh signal to preserve stored information;

means for detecting when a non-memory operation is taking place and for causing said memory system to be refreshed during the time interval when said non-memory operation is taking place, said means for detecting being connected to said first processor;

a second processor having defined time intervals during which either memory, or non-memory operations take place;

an electrical connection between said first processor and said second processor; and an electrical connection between said memory system and both said first and said second processor said last mentioned electrical connection between said first processor and said memory system including means for transmitting a force refresh signal to said memory system when both said first and said second processors are performing a non-memory operation, said first processor being a maintenance processor controlling when said memory system is force refreshed.

* * * * *